United States Patent [19]

Makino

[11] Patent Number: 6,014,337
[45] Date of Patent: Jan. 11, 2000

[54] SEMICONDUCTOR STORAGE DEVICE

[75] Inventor: Tatsushi Makino, Tokyo, Japan

[73] Assignee: NEC Corporation, Tokyo, Japan

[21] Appl. No.: 09/192,447

[22] Filed: Nov. 17, 1998

[30] Foreign Application Priority Data

Nov. 17, 1997 [JP] Japan .................................. 9-315657

[51] Int. Cl.$^7$ ................................................. G11C 7/00
[52] U.S. Cl. ......................... 365/205; 365/207; 365/208
[58] Field of Search .................................... 365/205, 207, 365/208, 230.03, 226

[56] References Cited

U.S. PATENT DOCUMENTS

| | | | |
|---|---|---|---|
| 5,590,080 | 12/1996 | Hasagawa et al. ...................... | 365/207 |
| 5,706,244 | 1/1998 | Shimizu ............................. | 365/230.03 |
| 5,774,409 | 6/1998 | Yamazaki et al. .................. | 365/230.03 |
| 5,854,771 | 12/1998 | Mori .................................... | 365/230.03 |

*Primary Examiner*—Trong Phan
*Attorney, Agent, or Firm*—McGinn & Gibb, P.C.

[57] ABSTRACT

A semiconductor storage device having a plurality of banks therein, includes a main drive circuit (hereinafter referred to as a main SAPN circuit), provided for each bank, for driving a sense amplifier and an auxiliary drive circuit (hereinafter referred to as a sub-SAPN circuit) for holding electric potential after driving the sense amplifier. The main SAPN circuit of each bank is commonly connected to a VDD wiring and a GND wiring (hereinafter referred to as a main power-supply wiring), the sub-SAPN circuit of each bank is connected to each of the VDD wiring and the GND wiring which are provided for each bank and smaller in capacity than the main power-supply wiring, and after completion of a sensing operation by the sense amplifier of each bank, only the sub-SAPN circuit is set in an active state to hold electric potential of the sense amplifier.

8 Claims, 9 Drawing Sheets

SEMICONDUCTOR STORAGE DEVICE

BACKGROUND OF THE INVENTION

1. Field of the Invention

The present invention relates to a semiconductor storage device, and more specifically to a semiconductor storage device having a plurality of banks therein.

2. Description of the Prior Art

Described below is a conventional semiconductor storage device having a plurality of banks. FIG. 9 shows the arrangement of the circuit of the conventional semiconductor storage device including an upper A bank, a lower B bank, and memory cells distributed to a plurality of banks. A circuit (hereinafter referred to an SAPN circuit) for driving the source node of a sense amplifier to perform a reading/rewriting operation on the memory cell of each bank is provided between the banks. FIG. 7 shows the connection of the circuit of the semiconductor storage device. FIG. 8 is a timing chart showing the operation of the circuit shown in FIG. 7.

In FIG. 7, a memory cell area (1) of an A bank is arranged at an upper portion while a memory cell area (15) of a B bank is arranged at a lower portion. The memory cell area (1) of the A bank contains a memory cell (2) and a cell transistor (3) connecting the memory cell (2) with a first bit line (5). A word line (4) is connected to the gate of a cell transistor (3). The first bit lines (5) and second bit lines (6) are connected to a sense amplifier (7) for amplifying the difference in electric potential between the bit lines. The Pch source electric potential and the Nch source electric potential of the sense amplifier (7) are provided from an SAP output Pch transistor (11) and an SAN output Nch transistor (12) provided below the memory cell area (1) through an SAP wiring (9) and an SAN wiring (8). The gates of the SAP output Pch transistor (11) and the SAN output Nch transistor (12) are controlled by an SE signal (14). There also is a similar element group of the configuration in the lower B bank.

In the circuit shown in FIG. 7, the source nodes of the SAP output Pch transistor (11) of the A bank and an SAP output transistor (25) of the B bank are connected to the same VDD wiring (41), while the source nodes of the SAN output Nch transistor (12) of the A bank and an SAN output transistor (26) of the B bank are connected to the same GND wiring (42).

Normally, in a semiconductor storage device having multiple banks, there is a timing at which a sense amplifier in a bank is in an active state while another bank is performing a sensing operation. Furthermore, there is a timing at which a word line of a bank is in an inactive state while another bank is performing a sensing operation. However, it is not allowed in a normal operation mode that a plurality of banks simultaneously set the sense amplifiers in the active state.

The operation of the circuit is explained below by referring to the timing chart shown in FIG. 8. The number preceded by t in, for example, t8-1 indicating a time point refers to the number of a figure, and the number preceded by the hyphen refers to the occurrence order of a corresponding point. At time point t8-1, the word line (4) of the A bank is set in the active state. When the electric potential stored in a memory cell indicates a high level, the electric potential of the first bit line (5) rises if the word line is set in the active state. At this time, a small potential difference occurs between the first bit lines (5) and second bit lines (6). At time point t8-2, when the SE signal (14) indicates a high level and the signals in the SAP and SAN wirings are set in the active state, the sense amplifier (7) starts its operation. Through the sensing operation, the potential difference between the first bit lines (5) and second bit lines (6) is amplified, the electric potential of the first bit line (5) is transmitted and rewritten to the memory cell (2). Thus, the data reading and rewriting operations of the memory cell are completed. However, when the sense amplifier is in the active state, an electric charge is provided for a number of bit lines, thereby generating a large noise in the VDD wiring (41) and the GND wiring (42).

In the above-described operations, the sense amplifier in the B bank has been set in the inactive state. At time t8-3, the word line of the B bank enters the active state. As in the A bank, the SE signal of the B bank enters the active state at time t8-4, and the sensing operation starts. The sensing operation generates a sense noise in the VDD wiring (41) and the GND wiring (42). Since the A and B banks share the source of the SAP and SAN output transistor, the sense noise is also transmitted to the SAP wiring (9) and the SAN wiring (8) of the A bank, thereby reducing the electric potential of the first bit line (5) and of the memory cell (2). At this time, when the word line (4) of the A bank indicates a low level at time t8-5, the memory cell (2) is disconnected from the first bit line (5) with the amount of the electric charge reduced by the sense noise in another bank, thereby possibly generating a problem of, for example, an error read in the subsequent reading operation, etc.

To solve the above-described problem, each bank is provided with VDD wirings (45 and 47) and GND wirings (46 and 48) for providing an electric current for the SAP output Pch transistor and the SAN output Nch transistor for each bank to which the SAP wiring and the SAN wiring are connected respectively as shown in FIG. 5 according to the conventional technology. As shown in the timing chart shown in FIG. 6, a sense noise is generated in the VDD wiring (47) and the GND wiring (48) for the B bank at time t6-4 even when the operation is performed at the similar timing as shown in FIG. 8. However, since the VDD wiring (45) and the GND wiring (46) for the A bank have no influences, the electric charge stored in the memory cell (2) is not affected by the noise, and the word line for the A bank enters the inactive state at time point t6-5.

BRIEF SUMMARY OF THE INVENTION

Object of the Invention

As described above, when a sense amplifier enters the active state, a large noise is generated in the VDD wiring and the GND wiring of the SAPN circuit. To suppress the noise and improve the sense speed, a very thick wire is normally used for the VDD wiring and the GND wiring for the SAPN circuit. Furthermore, as described above, the VDD wiring and the GND wiring are provided for each bank according to the conventional technology to remove the undesired influence of the sense noise from other banks. This causes a conventional device to have a larger chip.

The object of the present invention is to reduce the size of a chip by removing or reducing the influence of the sense noise from other banks.

Summary of the Invention

The above-described problem can be solved by either of the following two means.

First Means

A main SAPN circuit for driving a sense amplifier and a sub-SAPN circuit for holding the electric potential of the driven sense amplifier are provided for each of a plurality of banks. The main SAPN circuit of each bank is commonly connected to a main power-supply wiring formed by a VDD wiring and a GND wiring. The sub-SAPN circuit of each bank is individually connected to a VDD wiring and a GND wiring which are provided for each bank and has a smaller capacity than the main power-supply wiring. After completion of the sensing operation in the sense amplifier of each bank, only the sub-SAPN circuit is set in the active state to hold the electric potential of the sense amplifier.

Second Means

A main SAPN circuit for driving a sense amplifier and a sub-SAPN circuit, which includes a transistor smaller and of higher resistance than the main SAPN circuit and holds the electric potential of the driven sense amplifier, are provided for each of a plurality of banks. The main SAPN circuit and the sub-SAPN circuit of each bank are connected to a common VDD wiring and a common GND wiring. After completion of the sensing operation in the sense amplifier of each bank, only the sub-SAPN circuit is set in the active state to hold the electric potential of the sense amplifier.

According to the above-described first means, a main system and a sub system are provided as an SAPN circuit. The main SAPN circuits of a plurality of banks share the main power-supply wiring formed by a VDD wiring and a GND wiring. After completion of the sensing operation, only the auxiliary power-supply wiring formed by small-capacity (small wiring width) VDD wiring and GND wiring for each bank is connected to the sub-SAPN circuit. The auxiliary power-supply wiring can remove the influence of the sense noise from other banks. Furthermore, since the main power-supply wiring which should be large in wiring width is shared by a plurality of banks, the resultant chip can be successfully small.

On the other hand, according to the second means, the main SAPN circuit is formed by a low-resistance and large-size transistor, the sub-SAPN circuit is formed by a high-resistance and small transistor, and an auxiliary power-supply wiring is not used at all. When the sensing operation is performed, the main SAPN circuit is utilized in the active state. After the sensing operation, only the sub-SAPN circuit is set in the active state. Thus, the influence of the sense noise from other banks can be reduced, even if not completely. Furthermore, since both main SAPN circuit and sub-SAPN circuit share a set of the VDD wiring and the GND wiring, the second means realizes a smaller chip, and is advantageous to the first means.

DETAILED DESCRIPTION OF THE PREFERRED EMBODIMENTS

Described below are the preferred embodiments of the present invention.

First Embodiment

In the above-described first or second means, both main SAPN circuit and sub-SAPN circuit are set in the active state when the sense amplifier is driven. After the sensing operation, the main SAPN circuit is set in the inactive state, and the electric potential of the sense amplifier is held by the active sub-SAPN circuit.

Second Embodiment

According to the first or second means, only the main SAPN circuit is set in the active state when the sense amplifier is driven, and the main SAPN circuit is set in the inactive state while the sub-SAPN circuit is set in the active state after the sensing operation, thereby holding the electric potential of the sense amplifier.

The difference between the first and second embodiments resides in whether the sub-SAPN circuit is set in the active state from the time when the sense amplifier is driven with the sub-SAPN circuit set in the active state as the state entered before holding the electric potential of the sense amplifier, or the sub-SAPN circuit is set in the active state only when it is required.

Third Embodiment

According to the above-described first means, the wiring width of the VDD wiring and the GND wiring provided for each bank is set to a value equal to or smaller than a half of the wiring width of the main power-supply wiring.

To realize a smaller chip, the wiring width of the VDD wiring and the GND wiring provided for each bank is minimized.

EXAMPLE

Figure 3:
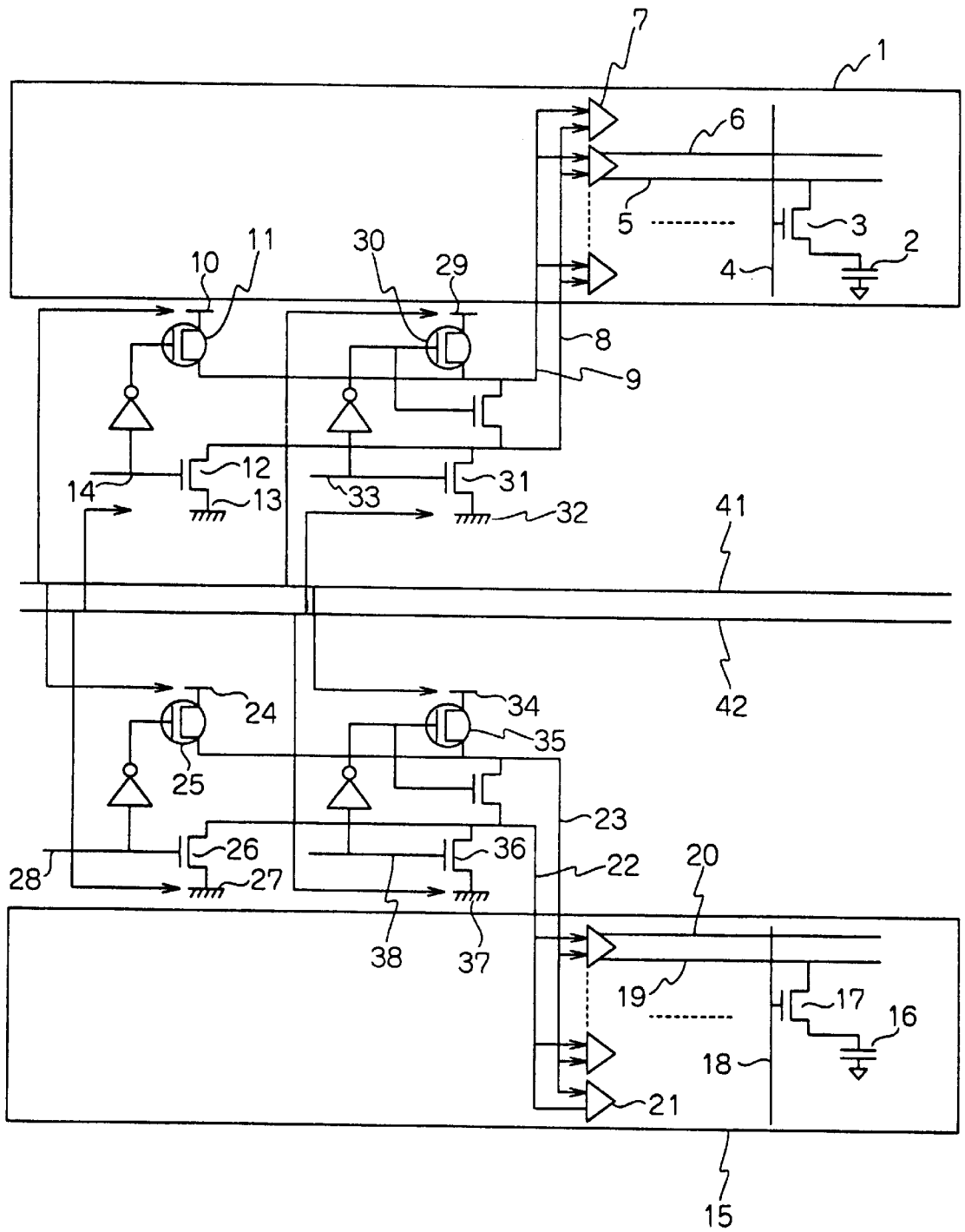
FIG. 3 shows the circuit of the semiconductor storage device according to the second embodiment of the present invention.
Figure 4:
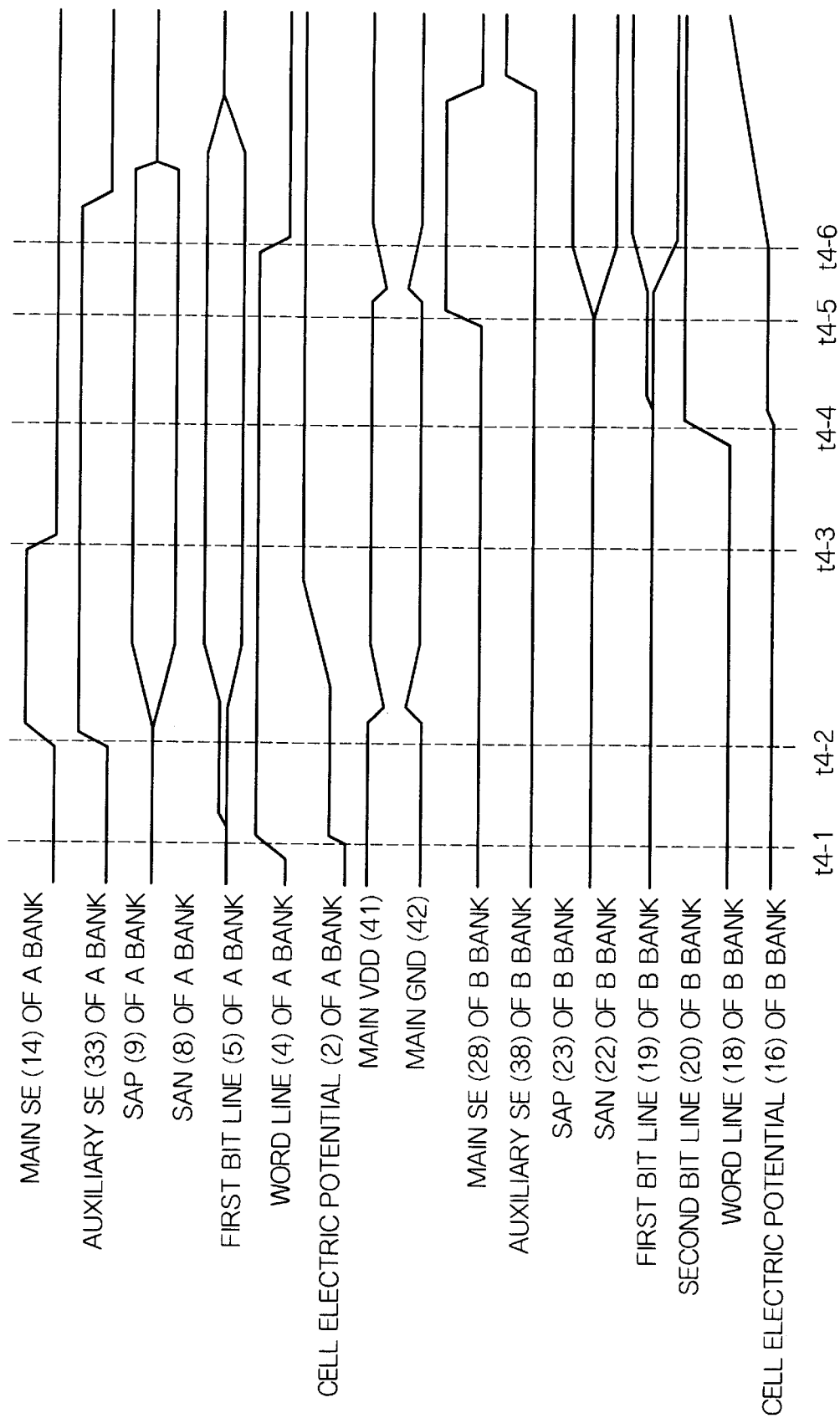
FIG. 4 is a timing chart of the second embodiment of the present invention.
Figure 5:
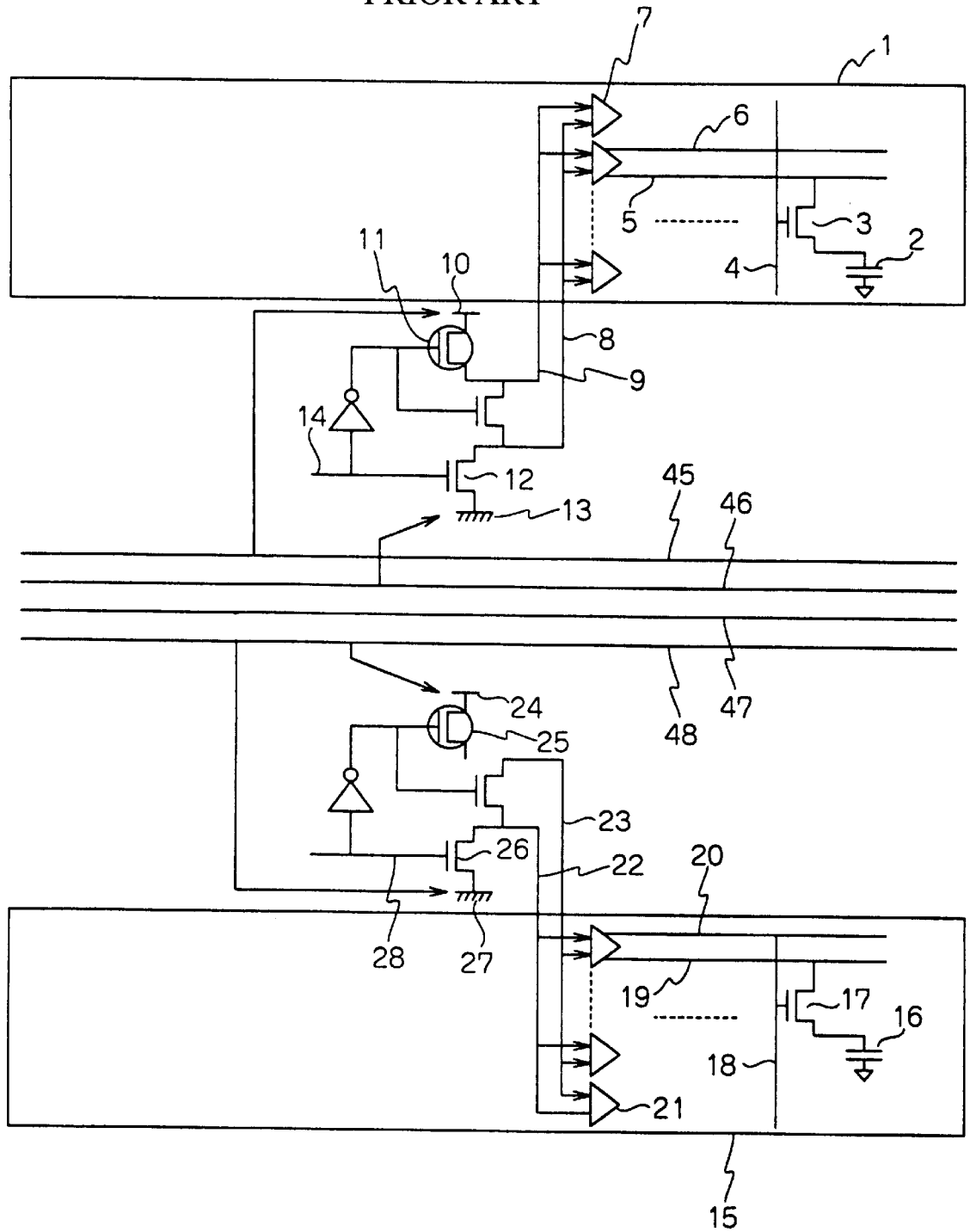
FIG. 5 shows the circuit according to the conventional technology.
Figure 6:
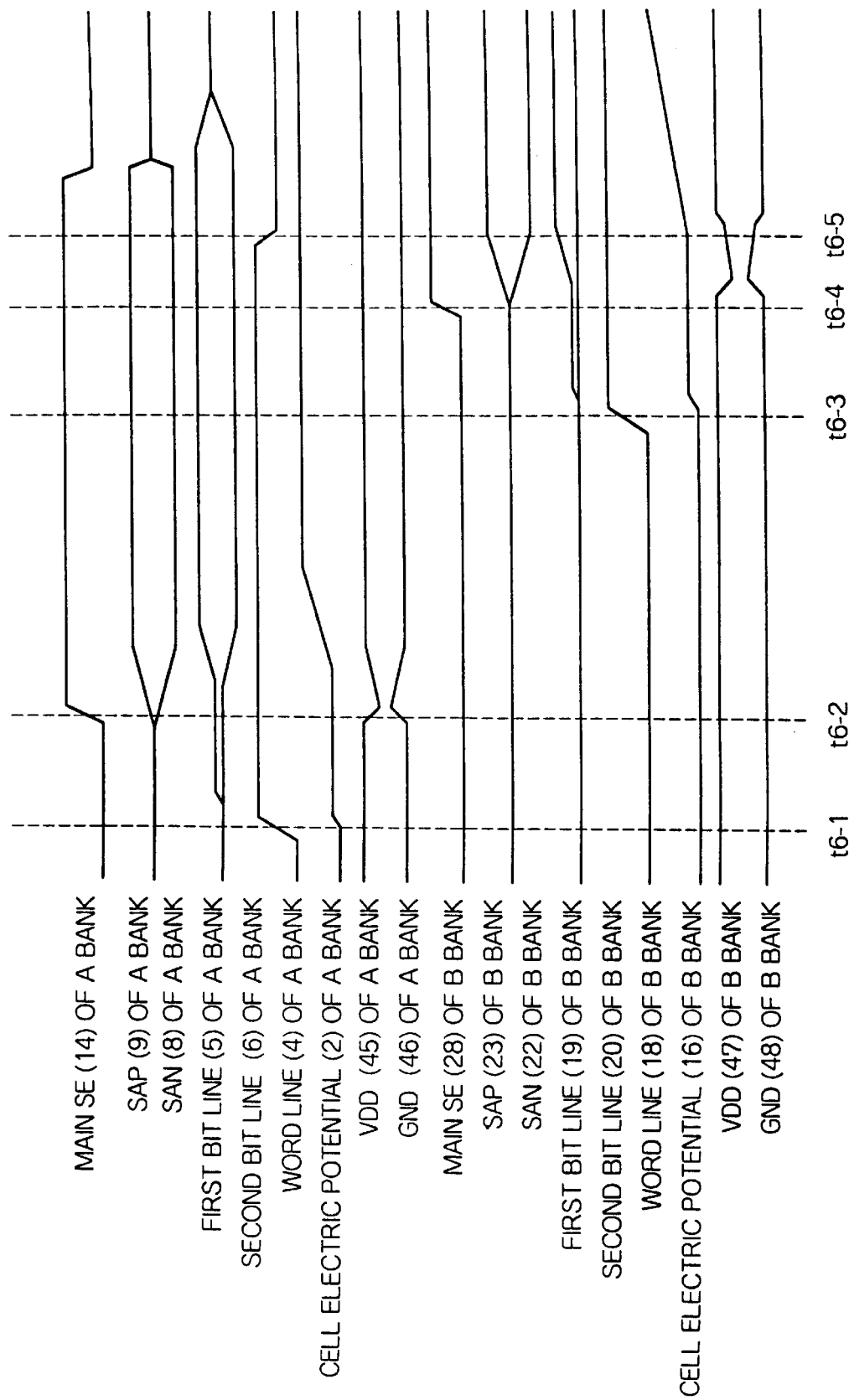
FIG. 6 is a timing chart according to the conventional technology.
Figure 7:
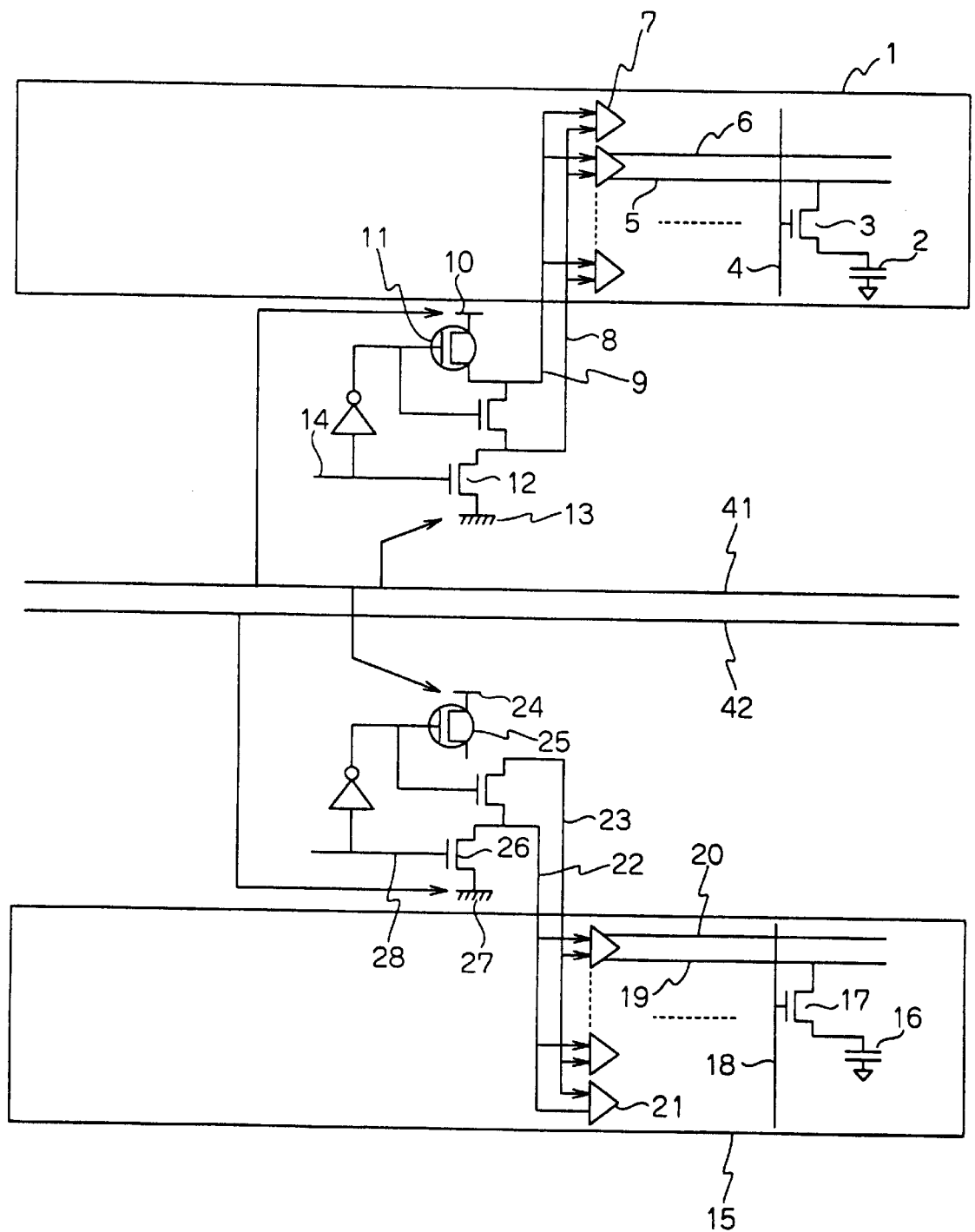
FIG. 7 shows the circuit indicating the complementary configuration for the conventional technology.
Figure 8:
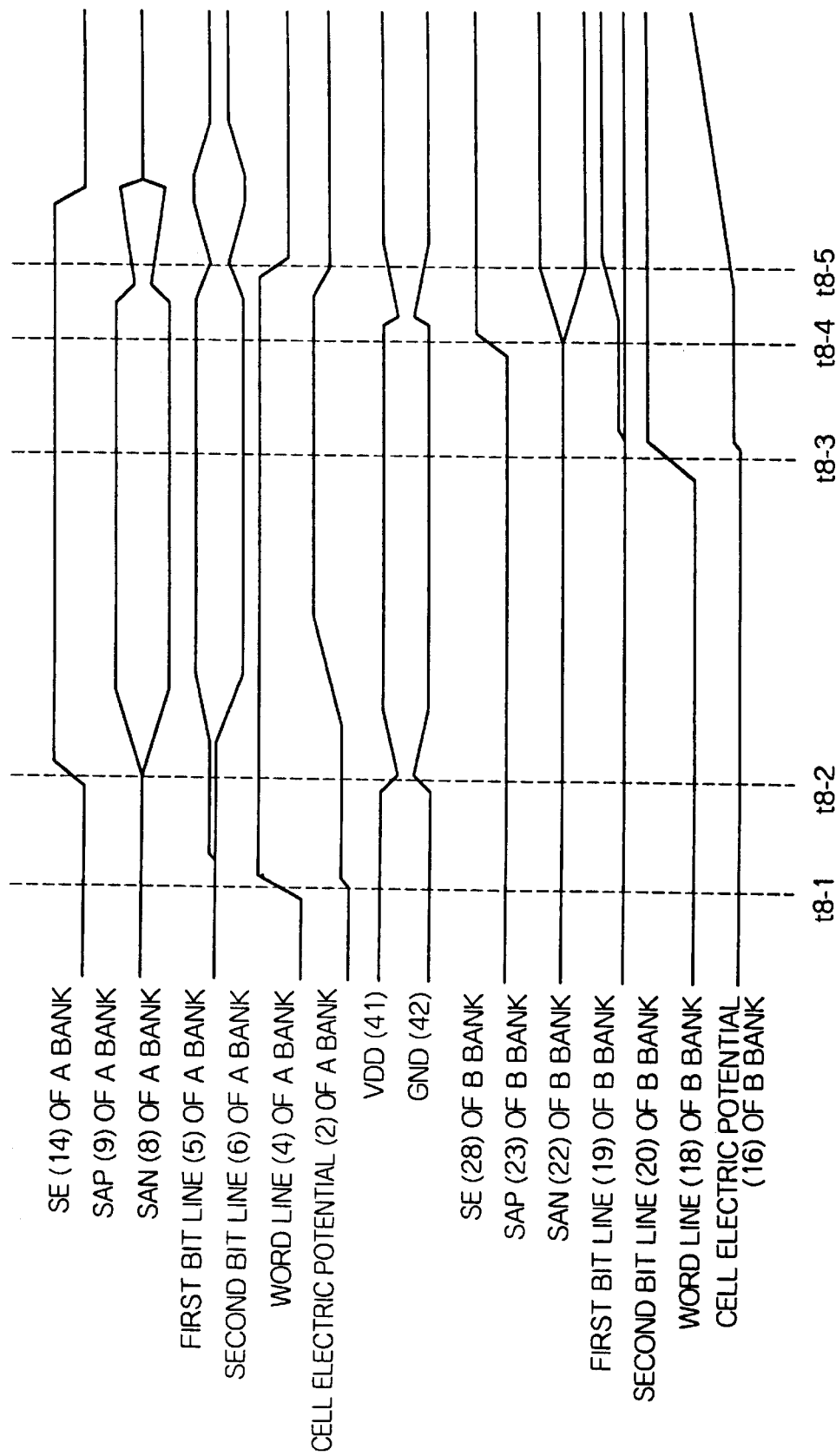
FIG. 8 is a timing chart of the complementary circuit configuration for the conventional technology.
Figure 9:
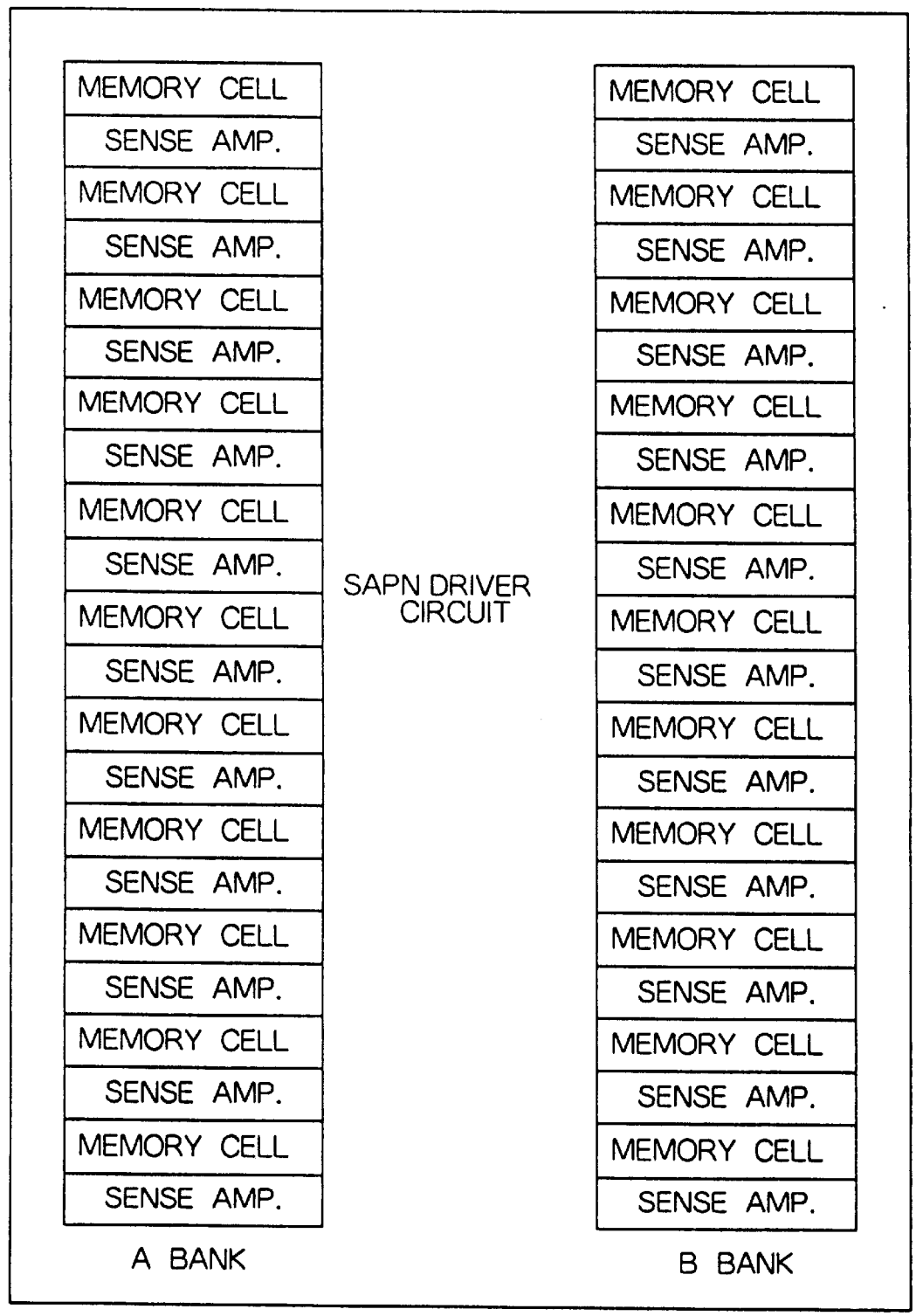
FIG. 9 shows the circuit of the semiconductor storage device having a plurality of banks.

The preferred example of the present invention is described below by referring to FIGS. 1 through 4. The same components of the conventional semiconductor storage device described by referring to FIGS. 5 and 7 are assigned the same reference numbers.

First Example

Figure 1:
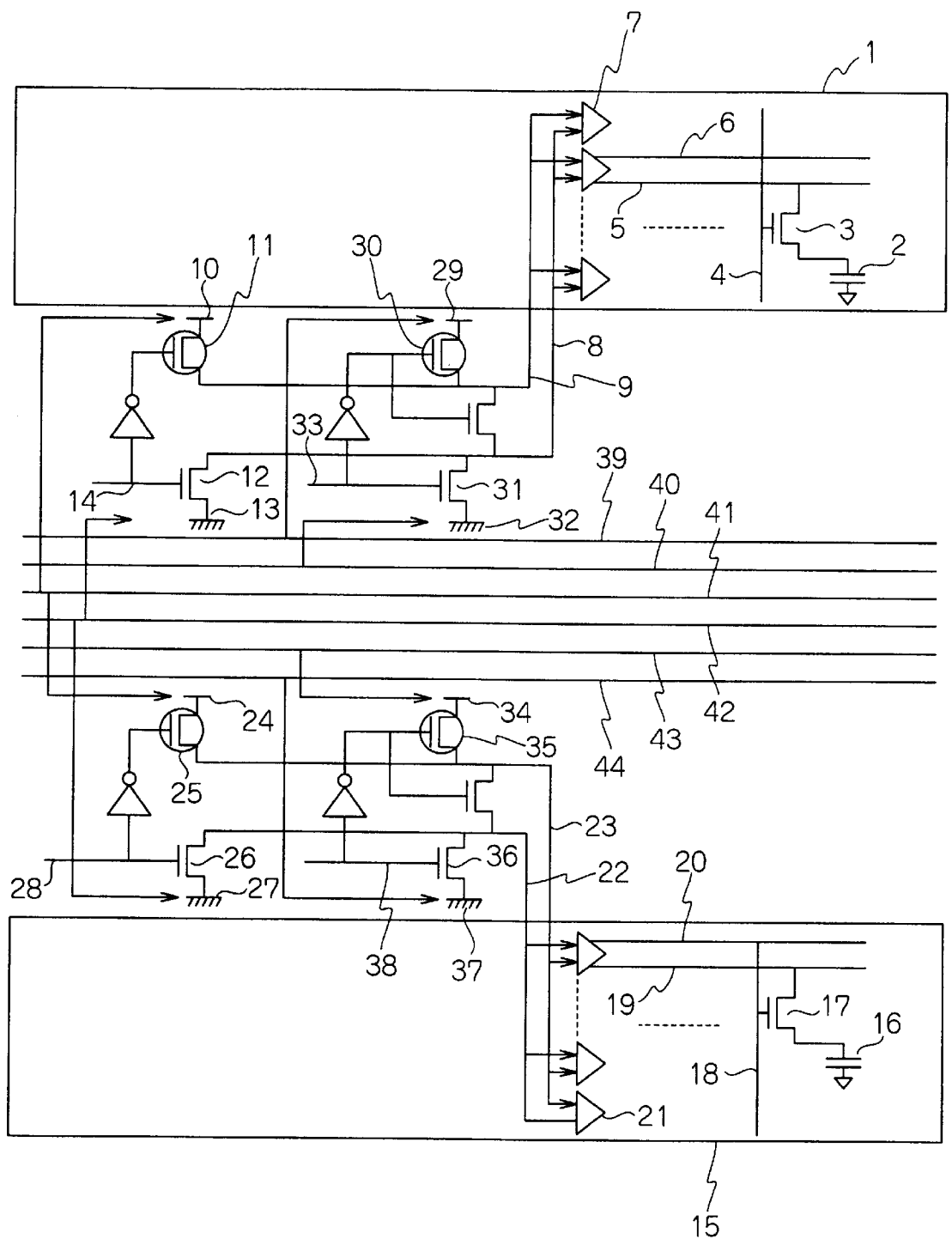
FIG. 1 shows the circuit of the semiconductor storage device according to the first embodiment of the present invention.
Figure 2:
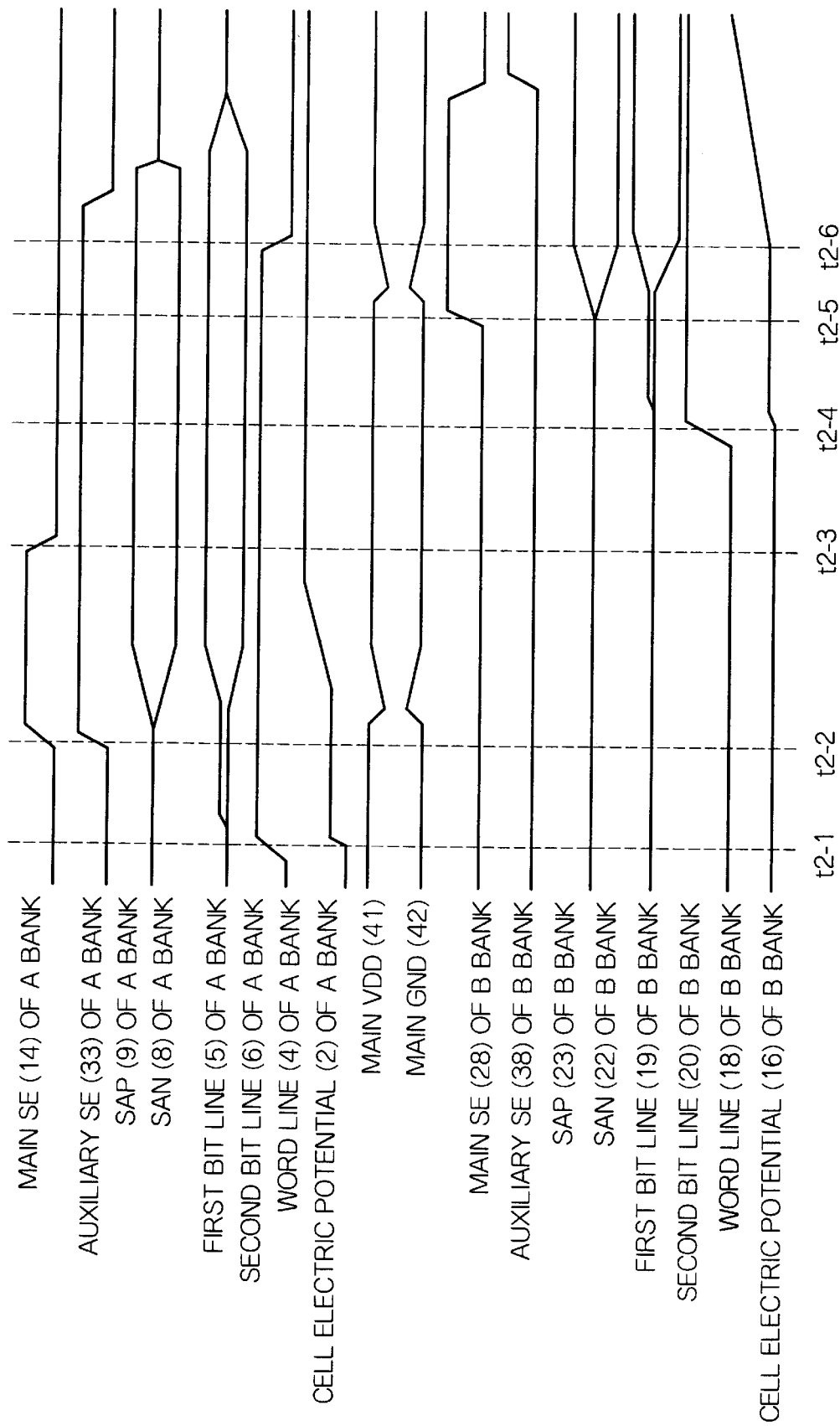
FIG. 2 is a timing chart of the first embodiment of the present invention.

FIG. 1 shows the circuit of the semiconductor storage device according to the first example of the present invention. FIG. 2 is a timing chart of the circuit. In FIG. 1, a reference number 29 is a source node of a sub-SAPN circuit transistor 30 of the A bank; 32 is a source node of a sub-SAPN circuit transistor 31 of the A bank; 33 is an SE signal for the sub-SAPN circuit of the A bank; 34 is a source node of a sub-SAPN circuit transistor 35 of the B bank; 37 is a source node of a sub-SAPN circuit transistor 36 of the B bank; 38 is an SE signal for the sub-SAPN circuit of the B bank; 39 is a VDD wiring as an auxiliary power-supply wiring of the A bank; 40 is a GND wiring as an auxiliary power-supply wiring of the A bank; 43 is a VDD wiring as an auxiliary power-supply wiring of the B bank; 44 is a GND wiring as an auxiliary power-supply wiring of the B bank; 41 is a VDD wiring as a main power-supply wiring common to each bank; and 42 is a GND wiring as a main power-supply wiring common to each bank. Other reference numbers 1 through 28 are the same as those shown in FIGS. 5 and 7.

That is, according to the present example, the sub-SAPN circuits comprising the transistors 30, 31, 35, and 36 are provided for each bank in addition to the main SAPN circuits of the A and B banks comprising the transistors 11, 12, 25, and 26. The VD wirings 39 and 43 and the GND wirings 40 and 44 are provided as the auxiliary power-supply wirings connected to these sub-SAPN circuits. The present example is different in the above-described configuration from the conventional technology.

The operation of the present example is described below by referring to the timing chart shown in FIG. 2. At time point t2-1, the word line 4 of the A bank enters the active state. At time point t2-2, the main SE signal of the A bank indicates a high level, the main SAPN circuit transistors 11 and 12 enter the active state, and the sensing operation starts. Simultaneously, the auxiliary SE signal 33 indicates a high level, thereby setting the sub-SAPN circuit transistors 30 and 31 in the active state.

At time point t2-3 when the sensing operation and the rewrite to a memory cell are completed, the main signal SE indicates a low level, and the main SAPN circuit transistors 11 and 12 enter the inactive state. However, the sub-SAPN circuit transistors 30 and 31 maintain the active state, and hold the electric potential of the SAP wiring 9 and the SAN wiring 8. In this state, even if the word line 18 of the B bank enters the active state at time point t2-4, the sensing operation starts in the B bank at time point t2-5, and a noise is generated in the main power-supply wirings 41 and 42, the memory cell 2 of the bank A is not affected by the noise.

In this case, since the sub-SAPN circuit transistors 30, 31, 35, and 36 do not require a strong current to maintain the active state, the wiring width of the auxiliary power-supply wirings 39, 40, 43, and 44 can be extremely thin, thereby reducing the size of the chip by 1 to 2% as compared with the case where the power-supply wirings 45 through 48 are provided for the sensing operation performed on the entire bank in the conventional technology.

Second Example

The second example of the present invention is described below by referring to FIGS. 3 and 4. FIG. 3 shows the circuit of the semiconductor storage device according to the second example of the present invention; and FIG. 4 is a timing chart for the semiconductor storage device.

Unlike the first example, the auxiliary power-supply wirings 39, 40, 43, and 44 are not provided according to the present example. However, small and high-resistance transistors are used as the sub-SAPN circuit transistors 30, 31, 35, and 36 for which an electric current is provided from the main power-supply wirings 41 and 42 described in the first example.

The operation according to the present example is described below by referring to the timing chart shown in FIG. 4. At time point t4-1, the word line 4 of the A bank enters the active state. At time point t4-2 the main SE signal of the A bank indicates the high level, the main SAPN circuit transistors 11 and 12 enter the active state, and the sensing operation is started. Simultaneously, when the auxiliary SE signal 33 indicates the high level, the sub-SAPN circuit transistors 30 and 31 also enter the active state.

At time point t4-3 when the sensing operation and the operation of rewriting to the memory cell are completed, the main SE signal indicates the low level, and the main SAPN circuit transistors 11 and 12 enter inactive state. However, the sub-SAPN circuit transistors 30 and 31 maintain the active state, and hold the electric potential of the SAP wiring 9 and the SAN wiring 8. In this state, the word line 18 of the B bank enters the active state at time point t4-4, and the sensing operation is started in the B bank at time point t4-5, thereby generating a noise in the main power-supply wirings 41 and 42. However, since the sub-SAPN circuit transistors 30 and 31 have high resistance, they reduce the transmission of the sense noise generated in the B bank to the memory cell 2 of the A bank.

According to the present example, the sense noise generated in another bank cannot be completely removed, but the present example is advantageous to the first example in chip size because it requires no auxiliary power-supply wirings for each bank.

The present invention has been described above based on the preferred embodiments. However, the semiconductor storage device of the present invention is not limited to the configuration according to the above-described embodiments. Actually, various amendments and alterations made to the configuration according to the above-described embodiments can be in the range of the present invention.

As described above, only an auxiliary power-supply wiring which is provided for each bank and has a narrow wiring width is connected to a sub-SAPN circuit according to the present invention. Therefore, an influence of a sense noise from another bank can be removed. Furthermore, since a plurality of banks share the main power-supply wiring which is required to be wide in wiring width, a smaller chip can be used.

Furthermore, instead of providing no auxiliary power-supply wirings for each bank, a sub-SAPN circuit can comprise a high-resistance transistor. In this case, a sense noise generated in another bank can be removed almost completely and an advantageous result can be obtained relating to the chip size.

What is claimed is:

1. A semiconductor storage device having a plurality of banks therein, comprising:

a main drive circuit comprising a main SAPN circuit, provided for each bank, for driving a sense amplifier; and an auxiliary drive circuit comprising a sub-SAPN circuit for holding electric potential after driving the sense amplifier, wherein said main SAPN circuit of each bank is commonly connected to a VDD wiring and a GND wiring comprising a main power-supply wiring, wherein said sub-SAPN circuit of each bank is connected to each of a VDD wiring and a GND wiring provided for each bank and smaller in capacity than the main power-supply wiring, and wherein after completion of a sensing operation by the sense amplifier of each bank, only the sub-SAPN circuit is set in an active state to hold electric potential of the sense amplifier.

2. The device according to claim 1, wherein said main SAPN circuit and said sub-SAPN circuit are both set in the active state when the sense amplifier is driven, only the main SAPN circuit is set in an inactive state after the completion of the sensing operation, and the electric potential of the sense amplifier is held by the sub-SAPN circuit in the active state.

3. The device according to claim 1, wherein only said main SAPN circuit is set in the active state when the sense amplifier is driven, and the main SAPN circuit is set in an inactive state while the sub-SAPN circuit is set in the active state after the completion of the sensing operation, thereby holding the electric potential of the sense amplifier.

4. The device according to claim 1, wherein a wiring width of the VDD wiring and the GND wiring having the smaller capacity is equal to or smaller than a half of a wiring width of the main power-supply wiring.

5. A semiconductor storage device having a plurality of banks therein, comprising:
   a main drive circuit comprising a main SAPN circuit, provided for each bank, for driving a sense amplifier; and
   an auxiliary drive circuit comprising a sub-SAPN circuit which comprises a transistor smaller and of higher-resistance than said main SAPN circuit and holds electric potential after driving the sense amplifier,
   wherein said main SAPN circuit and said sub-SAPN circuit of each bank are connected to a common VDD wiring and a common GND wiring, and
   wherein after completion of a sensing operation by the sense amplifier of each bank, only the sub-SAPN circuit is set in an active state to hold electric potential of the sense amplifier.

6. The device according to claim 5, wherein said main SAPN circuit and said sub-SAPN circuit are both set in the active state when the sense amplifier is driven, the main SAPN circuit is set in an inactive state after the completion of the sensing operation, and the electric potential of the sense amplifier is held by the sub-SAPN circuit in the active state.

7. The device according to claim 5, wherein only said main SAPN circuit is set in the active state when the sense amplifier is driven, and the main SAPN circuit is set in an inactive state while the sub-SAPN circuit is set in the active state after the completion of the sensing operation, and said sub-SAPN circuit holds the electric potential of the sense amplifier.

8. A semiconductor storage device having a plurality of banks therein, comprising:
   a main drive circuit comprising a main circuit, provided for each bank, for driving a sense amplifier; and
   an auxiliary drive circuit for holding electric potential after driving the sense amplifier,
   wherein said main circuit of each bank is commonly connected to a first wiring and a second wiring comprising a main power-supply wiring,
   wherein said auxiliary drive circuit of each bank is connected to each of a first wiring and a second wiring provided for each bank and different in capacity than the main power-supply wiring, and
   wherein after completion of a sensing operation by the sense amplifier of each bank, the auxiliary drive circuit is set in an active state to hold electric potential of the sense amplifier.

* * * * *